US008170724B2

(12) United States Patent
Kelley et al.

(10) Patent No.: US 8,170,724 B2
(45) Date of Patent: May 1, 2012

(54) SYSTEMS AND ASSOCIATED METHODS FOR CONTROLLABLY COOLING COMPUTER COMPONENTS

(75) Inventors: Douglas P. Kelley, Seattle, WA (US); Wade J. Doll, Seattle, WA (US); Alexander I. Yatskov, Kenmore, WA (US)

(73) Assignee: Cray Inc., Seattle, WA (US)

( * ) Notice: Subject to any disclaimer, the term of this patent is extended or adjusted under 35 U.S.C. 154(b) by 307 days.

(21) Appl. No.: 12/029,124

(22) Filed: Feb. 11, 2008

(65) Prior Publication Data
US 2009/0201644 A1 Aug. 13, 2009

(51) Int. Cl.
*G05D 23/00* (2006.01)

(52) U.S. Cl. ........ 700/299; 700/277; 700/300; 700/276; 700/282; 73/202.5; 361/694; 361/695; 361/699; 361/700; 361/687; 361/701; 361/679.49; 361/690; 340/501; 340/524; 702/130

(58) Field of Classification Search .................. 700/299, 700/300
See application file for complete search history.

(56) References Cited

U.S. PATENT DOCUMENTS

| | | |
|---|---|---|
| 2,628,018 A | 2/1953 | Koch |
| 2,673,721 A | 3/1954 | Dickinson |
| 2,861,782 A | 11/1958 | Swartz |
| 3,120,166 A | 2/1964 | Lyman |
| 3,192,306 A | 6/1965 | Skonnord |
| 3,236,296 A | 2/1966 | Dubin |
| 3,317,798 A | 5/1967 | Chu et al. |
| 3,348,609 A | 10/1967 | Dubin et al. |
| 3,525,385 A | 8/1970 | Liebert |
| 3,559,728 A | 2/1971 | Lyman et al. |
| 3,648,754 A | 3/1972 | Sephton |
| 3,903,404 A | 9/1975 | Beall et al. |
| 3,942,426 A | 3/1976 | Binks et al. |
| 4,016,357 A | 4/1977 | Abrahamsen |
| 4,158,875 A | 6/1979 | Tajima et al. |
| 4,261,519 A | 4/1981 | Ester |
| 4,270,362 A | 6/1981 | Lancia et al. |

(Continued)

FOREIGN PATENT DOCUMENTS

DE EP0741269 * 11/1996

(Continued)

OTHER PUBLICATIONS

U.S. Appl. No. 11/958,114, filed Dec. 17, 2007, Yatskov.

(Continued)

*Primary Examiner* — Albert Decady
*Assistant Examiner* — Olvin Lopez Alvarez
(74) *Attorney, Agent, or Firm* — Perkins Coie LLP

(57) ABSTRACT

Computer systems and associated methods for cooling computer components are disclosed herein. One embodiment of a computer system includes a computer cabinet having an air inlet spaced apart from an air outlet. The computer system also includes heat exchangers positioned in the computer cabinet, and a heat removal system in fluid communication with the heat exchangers. The computer system additionally includes at least one sensor for monitoring heat transfer between the computer cabinet and the room. The computer system further includes a control system operatively coupled to the at least one sensor, the control system including a computer-readable medium holding instructions for determining whether heat transfer between the computer cabinet and the room is balanced based on information from the sensor, and if not, adjusting a parameter to balance the heat transfer.

10 Claims, 6 Drawing Sheets

U.S. PATENT DOCUMENTS

| | | | |
|---|---|---|---|
| 4,271,678 A | 6/1981 | Liebert | |
| 4,306,613 A | 12/1981 | Christopher | |
| 4,313,310 A | 2/1982 | Kobayashi et al. | |
| 4,315,300 A | 2/1982 | Parmerlee et al. | |
| 4,386,651 A | 6/1983 | Reinhard | |
| 4,449,579 A | 5/1984 | Miyazaki et al. | |
| 4,458,296 A | 7/1984 | Bryant et al. | |
| 4,473,382 A | 9/1984 | Cheslock | |
| 4,513,351 A | 4/1985 | Davis et al. | |
| 4,528,614 A | 7/1985 | Shariff et al. | |
| 4,535,386 A | 8/1985 | Frey, Jr. et al. | |
| 4,600,050 A | 7/1986 | Noren | |
| 4,642,715 A | 2/1987 | Ende | |
| 4,644,443 A | 2/1987 | Swensen et al. | |
| 4,691,274 A | 9/1987 | Matouk et al. | |
| 4,702,154 A | 10/1987 | Dodson | |
| 4,728,160 A | 3/1988 | Mondor et al. | |
| 4,767,262 A | 8/1988 | Simon | |
| 4,774,631 A | 9/1988 | Okuyama et al. | |
| 4,797,783 A | 1/1989 | Kohmoto et al. | |
| 4,798,238 A | 1/1989 | Ghiraldi | |
| 4,802,060 A | 1/1989 | Immel | |
| 4,860,163 A | 8/1989 | Sarath | |
| 4,874,127 A | 10/1989 | Collier | |
| 4,901,200 A | 2/1990 | Mazura | |
| 4,911,231 A | 3/1990 | Horne et al. | |
| 4,993,482 A | 2/1991 | Dolbear et al. | |
| 5,000,079 A | 3/1991 | Mardis | |
| 5,019,880 A | 5/1991 | Higgins, III | |
| 5,035,628 A | 7/1991 | Casciotti et al. | |
| 5,060,716 A | 10/1991 | Heine | |
| 5,090,476 A | 2/1992 | Immel | |
| 5,101,320 A | 3/1992 | Bhargava et al. | |
| 5,131,233 A | 7/1992 | Cray et al. | |
| 5,150,277 A | 9/1992 | Bainbridge et al. | |
| 5,161,087 A | 11/1992 | Frankeny et al. | |
| 5,165,466 A | 11/1992 | Arbabian | |
| 5,168,925 A | 12/1992 | Suzumura et al. | |
| 5,196,989 A | 3/1993 | Zsolnay | |
| 5,263,538 A | 11/1993 | Amidieu et al. | |
| 5,273,438 A | 12/1993 | Bradley | |
| 5,297,990 A | 3/1994 | Renz et al. | |
| 5,323,847 A | 6/1994 | Koizumi et al. | |
| 5,326,317 A | 7/1994 | Ishizu et al. | |
| 5,329,425 A | 7/1994 | Leyssens et al. | |
| 5,339,214 A | 8/1994 | Nelson | |
| 5,345,779 A | 9/1994 | Feeney | |
| 5,365,402 A | 11/1994 | Hatada et al. | |
| 5,376,008 A | 12/1994 | Rodriguez | |
| 5,395,251 A | 3/1995 | Rodriguez et al. | |
| 5,402,313 A | 3/1995 | Casperson et al. | |
| 5,410,448 A | 4/1995 | Barker, III et al. | |
| 5,414,591 A | 5/1995 | Kimura et al. | |
| 5,467,250 A | 11/1995 | Howard et al. | |
| 5,467,609 A | 11/1995 | Feeney | |
| 5,471,850 A | 12/1995 | Cowans | |
| 5,491,310 A | 2/1996 | Jen | |
| 5,493,474 A | 2/1996 | Schkrohowsky et al. | |
| 5,547,272 A | 8/1996 | Paterson et al. | |
| 5,570,740 A | 11/1996 | Flores et al. | |
| 5,572,403 A | 11/1996 | Mills | |
| 5,603,375 A | 2/1997 | Salt | |
| 5,603,376 A | 2/1997 | Hendrix | |
| 5,684,671 A | 11/1997 | Hobbs et al. | |
| 5,685,363 A | 11/1997 | Orihira et al. | |
| 5,707,205 A | 1/1998 | Otsuka | |
| 5,709,100 A | 1/1998 | Baer et al. | |
| 5,718,628 A | 2/1998 | Nakazato et al. | |
| 5,749,702 A | 5/1998 | Datta et al. | |
| 5,782,546 A | 7/1998 | Iwatare | |
| 5,793,610 A | 8/1998 | Schmitt et al. | |
| 5,829,676 A * | 11/1998 | Ban et al. | 237/12.3 R |
| 5,849,076 A * | 12/1998 | Gaylord et al. | 117/85 |
| 5,880,931 A | 3/1999 | Tilton et al. | |
| 5,927,386 A | 7/1999 | Lin | |
| 5,979,541 A | 11/1999 | Saito | |
| 6,021,047 A | 2/2000 | Lopez et al. | |
| 6,024,165 A | 2/2000 | Melane et al. | |
| 6,026,565 A | 2/2000 | Giannatto et al. | |
| 6,034,870 A | 3/2000 | Osborn et al. | |
| 6,039,414 A | 3/2000 | Melane et al. | |
| 6,046,908 A | 4/2000 | Feng | |
| 6,052,278 A | 4/2000 | Tanzer et al. | |
| 6,061,237 A | 5/2000 | Sands et al. | |
| 6,104,608 A | 8/2000 | Casinelli et al. | |
| 6,115,242 A | 9/2000 | Lambrecht | |
| 6,132,171 A | 10/2000 | Fujinaka et al. | |
| 6,135,875 A | 10/2000 | French | |
| 6,158,502 A | 12/2000 | Thomas | |
| 6,164,369 A | 12/2000 | Stoller | |
| 6,167,948 B1 | 1/2001 | Thomas | |
| 6,182,787 B1 | 2/2001 | Kraft et al. | |
| 6,183,196 B1 | 2/2001 | Fujinaka | |
| 6,185,098 B1 | 2/2001 | Benavides | |
| 6,205,796 B1 | 3/2001 | Chu et al. | |
| 6,208,510 B1 | 3/2001 | Trudeau et al. | |
| 6,236,564 B1 | 5/2001 | Fan | |
| 6,272,012 B1 | 8/2001 | Medin et al. | |
| 6,305,180 B1 | 10/2001 | Miller et al. | |
| 6,310,773 B1 | 10/2001 | Yusuf et al. | |
| 6,332,946 B1 | 12/2001 | Emmett et al. | |
| 6,351,381 B1 | 2/2002 | Bilski et al. | |
| 6,359,779 B1 | 3/2002 | Frank, Jr. et al. | |
| 6,361,892 B1 | 3/2002 | Ruhl et al. | |
| 6,396,684 B2 | 5/2002 | Lee | |
| 6,416,330 B1 | 7/2002 | Yatskov | |
| 6,435,266 B1 | 8/2002 | Wu | |
| 6,439,340 B1 | 8/2002 | Shirvan | |
| 6,462,944 B1 | 10/2002 | Lin | |
| 6,481,527 B1 | 11/2002 | French et al. | |
| 6,501,652 B2 | 12/2002 | Katsui | |
| 6,515,862 B1 | 2/2003 | Wong et al. | |
| 6,519,955 B2 | 2/2003 | Marsala | |
| 6,524,064 B2 | 2/2003 | Chou et al. | |
| 6,542,362 B2 | 4/2003 | Lajara et al. | |
| 6,546,998 B2 | 4/2003 | Oh et al. | |
| 6,550,530 B1 | 4/2003 | Bilski | |
| 6,554,697 B1 | 4/2003 | Koplin | |
| 6,557,357 B2 | 5/2003 | Spinazzola et al. | |
| 6,557,624 B1 | 5/2003 | Stahl et al. | |
| 6,564,571 B2 | 5/2003 | Feeney | |
| 6,564,858 B1 | 5/2003 | Stahl | |
| 6,582,192 B2 | 6/2003 | Tseng | |
| 6,587,340 B2 | 7/2003 | Grouell et al. | |
| 6,609,592 B2 | 8/2003 | Wilson | |
| 6,628,520 B2 * | 9/2003 | Patel et al. | 361/696 |
| 6,631,078 B2 | 10/2003 | Alcoe | |
| 6,644,384 B2 | 11/2003 | Stahl | |
| 6,661,660 B2 | 12/2003 | Prasher et al. | |
| 6,679,081 B2 | 1/2004 | Marsala | |
| 6,684,457 B2 | 2/2004 | Holt | |
| 6,690,576 B2 | 2/2004 | Clements et al. | |
| 6,705,625 B2 | 3/2004 | Holt et al. | |
| 6,714,412 B1 | 3/2004 | Chu et al. | |
| 6,724,617 B2 | 4/2004 | Amaike et al. | |
| 6,742,068 B2 | 5/2004 | Gallagher et al. | |
| 6,745,579 B2 | 6/2004 | Spinazzola et al. | |
| 6,755,280 B2 | 6/2004 | Porte et al. | |
| 6,761,212 B2 | 7/2004 | DiPaolo | |
| 6,772,604 B2 | 8/2004 | Bash et al. | |
| 6,775,137 B2 | 8/2004 | Chu et al. | |
| 6,776,707 B2 | 8/2004 | Koplin | |
| 6,796,372 B2 | 9/2004 | Bear | |
| 6,801,428 B2 | 10/2004 | Smith et al. | |
| 6,819,563 B1 | 11/2004 | Chu et al. | |
| 6,836,407 B2 | 12/2004 | Faneuf et al. | |
| 6,854,287 B2 * | 2/2005 | Patel et al. | 62/259.2 |
| 6,854,659 B2 | 2/2005 | Stahl et al. | |
| 6,860,713 B2 | 3/2005 | Hoover | |
| 6,867,966 B2 | 3/2005 | Smith et al. | |
| 6,875,101 B1 | 4/2005 | Chien | |
| 6,876,549 B2 | 4/2005 | Beitelmal et al. | |
| 6,881,898 B2 | 4/2005 | Baker et al. | |
| 6,882,531 B2 | 4/2005 | Modica | |
| 6,904,968 B2 | 6/2005 | Beitelmal et al. | |
| 6,909,611 B2 | 6/2005 | Smith et al. | |
| 6,914,780 B1 | 7/2005 | Shanker et al. | |

| | | | |
|---|---|---|---|
| 6,932,443 B1 | 8/2005 | Kaplan et al. | |
| 6,975,510 B1 | 12/2005 | Robbins et al. | |
| 6,992,889 B1 | 1/2006 | Kashiwagi et al. | |
| 6,997,245 B2 | 2/2006 | Lindemuth et al. | |
| 6,997,741 B2 | 2/2006 | Doll | |
| 6,999,316 B2 | 2/2006 | Hamman | |
| 7,016,191 B2 | 3/2006 | Miyamoto et al. | |
| 7,051,802 B2* | 5/2006 | Baer | 165/299 |
| 7,051,946 B2* | 5/2006 | Bash et al. | 236/49.3 |
| 7,059,899 B2 | 6/2006 | Doll | |
| 7,114,555 B2* | 10/2006 | Patel et al. | 165/247 |
| 7,120,017 B2 | 10/2006 | Shieh | |
| 7,120,027 B2 | 10/2006 | Yatskov et al. | |
| 7,123,477 B2 | 10/2006 | Coglitore et al. | |
| 7,144,320 B2 | 12/2006 | Turek et al. | |
| 7,152,418 B2 | 12/2006 | Alappat et al. | |
| 7,154,748 B2 | 12/2006 | Yamada | |
| 7,177,156 B2 | 2/2007 | Yatskov et al. | |
| 7,182,208 B2 | 2/2007 | Tachibana | |
| 7,187,549 B2 | 3/2007 | Teneketges et al. | |
| 7,193,846 B1 | 3/2007 | Davis et al. | |
| 7,193,851 B2 | 3/2007 | Yatskov et al. | |
| 7,209,351 B2 | 4/2007 | Wei | |
| 7,215,552 B2 | 5/2007 | Shipley et al. | |
| 7,218,516 B2 | 5/2007 | Yu et al. | |
| 7,222,660 B2 | 5/2007 | Giacoma et al. | |
| 7,226,353 B2 | 6/2007 | Bettridge et al. | |
| 7,242,579 B2 | 7/2007 | Fernandez et al. | |
| 7,255,640 B2 | 8/2007 | Aldag et al. | |
| 7,259,963 B2 | 8/2007 | Germagian et al. | |
| 7,286,351 B2 | 10/2007 | Campbell et al. | |
| 7,304,842 B2 | 12/2007 | Yatskov et al. | |
| 7,314,113 B2 | 1/2008 | Doll | |
| 7,315,448 B1* | 1/2008 | Bash et al. | 361/701 |
| 7,330,350 B2 | 2/2008 | Hellregel et al. | |
| 7,362,571 B2 | 4/2008 | Kelley et al. | |
| 7,385,810 B2 | 6/2008 | Chu et al. | |
| 7,397,661 B2 | 7/2008 | Campbell et al. | |
| 7,411,785 B2 | 8/2008 | Doll | |
| 7,418,825 B1 | 9/2008 | Bean, Jr. | |
| 7,420,805 B2 | 9/2008 | Smith et al. | |
| 7,430,118 B1 | 9/2008 | Noteboom et al. | |
| 7,513,923 B1 | 4/2009 | Lewis et al. | |
| 7,542,287 B2 | 6/2009 | Lewis, II et al. | |
| 7,554,803 B2 | 6/2009 | Artman et al. | |
| 7,707,880 B2* | 5/2010 | Campbell et al. | 73/202.5 |
| 7,710,720 B2 | 5/2010 | Fuke et al. | |
| 7,830,658 B2 | 11/2010 | Van Andel | |
| 7,895,854 B2* | 3/2011 | Bash et al. | 62/259.2 |
| 7,903,403 B2* | 3/2011 | Doll et al. | 361/679.5 |
| 2001/0052412 A1 | 12/2001 | Tikka | |
| 2002/0072809 A1* | 6/2002 | Zuraw | 700/9 |
| 2002/0172007 A1 | 11/2002 | Pautsch | |
| 2002/0181200 A1 | 12/2002 | Chang | |
| 2003/0010477 A1 | 1/2003 | Khrustalev et al. | |
| 2003/0053928 A1* | 3/2003 | Takano | 422/26 |
| 2003/0056941 A1 | 3/2003 | Lai et al. | |
| 2003/0161102 A1 | 8/2003 | Lee et al. | |
| 2003/0183446 A1 | 10/2003 | Shah et al. | |
| 2004/0008491 A1 | 1/2004 | Chen | |
| 2004/0020225 A1* | 2/2004 | Patel et al. | 62/229 |
| 2004/0033135 A1 | 2/2004 | Chang | |
| 2004/0052052 A1 | 3/2004 | Rivera | |
| 2004/0250990 A1 | 12/2004 | Schaper | |
| 2005/0120737 A1 | 6/2005 | Borror et al. | |
| 2005/0161205 A1 | 7/2005 | Ashe et al. | |
| 2005/0162834 A1 | 7/2005 | Nishimura | |
| 2005/0168945 A1 | 8/2005 | Coglitore | |
| 2005/0186070 A1 | 8/2005 | Zeng et al. | |
| 2005/0207116 A1 | 9/2005 | Yatskov | |
| 2005/0225936 A1 | 10/2005 | Day | |
| 2005/0241810 A1 | 11/2005 | Malone et al. | |
| 2006/0018094 A1 | 1/2006 | Robbins et al. | |
| 2006/0044758 A1 | 3/2006 | Spangberg | |
| 2006/0102322 A1 | 5/2006 | Madara | |
| 2006/0180301 A1 | 8/2006 | Baer | |
| 2007/0030650 A1 | 2/2007 | Madara et al. | |
| 2007/0211428 A1 | 9/2007 | Doll | |
| 2007/0224084 A1* | 9/2007 | Holmes et al. | 422/68.1 |
| 2008/0018212 A1 | 1/2008 | Spearing et al. | |
| 2008/0078202 A1 | 4/2008 | Luo | |
| 2008/0092387 A1 | 4/2008 | Campbell et al. | |
| 2008/0098763 A1 | 5/2008 | Yamaoka | |
| 2008/0112128 A1 | 5/2008 | Holland | |
| 2008/0158814 A1 | 7/2008 | Hattori | |
| 2008/0212282 A1* | 9/2008 | Hall et al. | 361/701 |
| 2008/0216493 A1 | 9/2008 | Lin et al. | |
| 2009/0236006 A1* | 9/2009 | Farese et al. | 141/3 |
| 2009/0260384 A1 | 10/2009 | Champion et al. | |
| 2011/0112694 A1* | 5/2011 | Bash et al. | 700/277 |

FOREIGN PATENT DOCUMENTS

| | | |
|---|---|---|
| JP | 2004-079754 | 8/2002 |
| WO | WO 01/86217 | 11/2001 |
| WO | WO 2005/027609 | 3/2005 |

OTHER PUBLICATIONS

U.S. Appl. No. 12/060,377, filed Apr. 1, 2008, Doll.
Baer, D. B., "Emerging Cooling Requirements & Systems in Telecommunications Spaces," Telecommunications Energy Conference 2001, Oct. 14-18, 2001, pp. 95-100.
Bleier, F. P., "FAN Handbook, Selection, Application, and Design," McGraw Hill, 1998, pp. 7.50-7.51.
"Frequently Asked Questions about Heat Pipes," Thermacore International, Inc., http://www.thermacore.com/hpt_faqs.htm, 3 pages [accessed Jun. 14, 2004].
Hannemann, R. et al., "Pumped Liquid Multiphase Cooling," ASME, 2004, IMECE 2004, Paper IMECE2004-60669, Anaheim, CA, 5 pages.
Novel Concepts, Inc., "Heat Spreaders," http://www.novelconceptsinc.com/heat-spreaders.htm, 2 pages [accessed Jun. 14, 2004].
JAMSTEC/Earth Simulator Center, "Processor Node (PN) Cabinet," http://www.es.jamstec.go.jp/esc/eng/Hardware/pnc.html, 1 page [accessed Mar. 5, 2004].
"Managing Extreme Heat Cooling Strategies for High-Density Computer Systems," Liebert Corporation, Dec. 7, 2003, Columbus, OH, 16 pages.
Marsala, J., "Pumped Liquid/Two Phase Cooling for High Performance Systems," Thermal Form & Function LLC, May 13, 2003, Scottsdale, AZ, 19 pages.
Pitasi, M. "Thermal Management System Using Pumped Liquid R-134a with Two Phase Heat Transfer," Thermal Form & Function LLC, Manchester, MA, Mar. 2002, pp. 1-9, http://www.coolingzone.com/Guest/News/NL_MAR_2002/TFF/Tff.html.
"Therma-base-Heat Sink," Thermacore Thermal Management Solutions, pp. 1-3, [accessed Jun. 14, 2005].
Thermal Form & Function LLC, "Box/Blade Cooling System," http://www.thermalformandfunction.com/boxsystem.html, Manchester, MA, 2005, 1 page [accessed May 10, 2006].
"Thermal Form & Function—Rack Cooling System (RCS)," Thermal Form & Function LLC, 2005, Manchester, MA, one page, http://www.thermalformandfunction.com/racksystem.html, [accessed May 11, 2006].
Vogel, M. et al., "Low Profile Heat Sink Cooling Technologies for Next Generation CPU Thermal Designs," Electronic Cooling Online, Feb. 17, 2005, 11 pages.
Webb, W., "Take the heat: Cool that hot embedded design," EDN, May 13, 2004, 5 pages.
U.S. Appl. No. 12/253,672, filed Oct. 17, 2008, Doll et al.
U.S. Appl. No. 12/253,692, filed Oct. 17, 2008, Doll et al.
Non-Final Office Action for U.S. Appl. No. 11/371,272, Mail Date Mar. 19, 2009, 13 pages.
Non-Final Office Action for U.S. Appl. No. 11/958,114, Mail Date Aug. 25, 2009, 22 pages.
Non-Final Office Action for U.S. Appl. No. 12/060,377, Mail Date Sep. 23, 2009, 20 pages.
U.S. Appl. No. 12/763,977, filed Apr. 20, 2010, Doll.
Final Office Action for U.S. Appl. No. 11/958,114, Mail Date Apr. 9, 2010, 28 pages.

* cited by examiner

SYSTEMS AND ASSOCIATED METHODS FOR CONTROLLABLY COOLING COMPUTER COMPONENTS

TECHNICAL FIELD

The present disclosure relates generally to cooling systems and related methods for controllably cooling computer components.

BACKGROUND

Supercomputers and other large computer systems typically include a large number of computer modules housed in cabinets arranged in banks. The computer modules are typically positioned in close proximity to each other. In operation, the modules can generate considerable heat, and the close proximity of the modules can make dissipating the heat difficult. If not dissipated, the heat can damage the modules or significantly reduce system performance.

One conventional technique for computer module cooling includes drawing cooling air into the cabinet to cool the computer modules, and discharging the heated cooling air to the room. Typically, the heat transfer between the cooling air and the computer modules is uncontrolled. This can reduce cooling efficiency and the performance of the computer modules. Accordingly, there is a need to effectively dissipate heat generated by computer modules during operation.

DETAILED DESCRIPTION

The following disclosure describes several embodiments of cooling systems for use with computers and other systems. Several other embodiments of the invention can have different configurations, components, or procedures than those described in this section. A person of ordinary skill in the art, therefore, will accordingly understand that the invention can have other embodiments with additional elements, or the invention can have other embodiments without several of the features shown and described below with reference to FIGS. 1-6.

Figure 1:
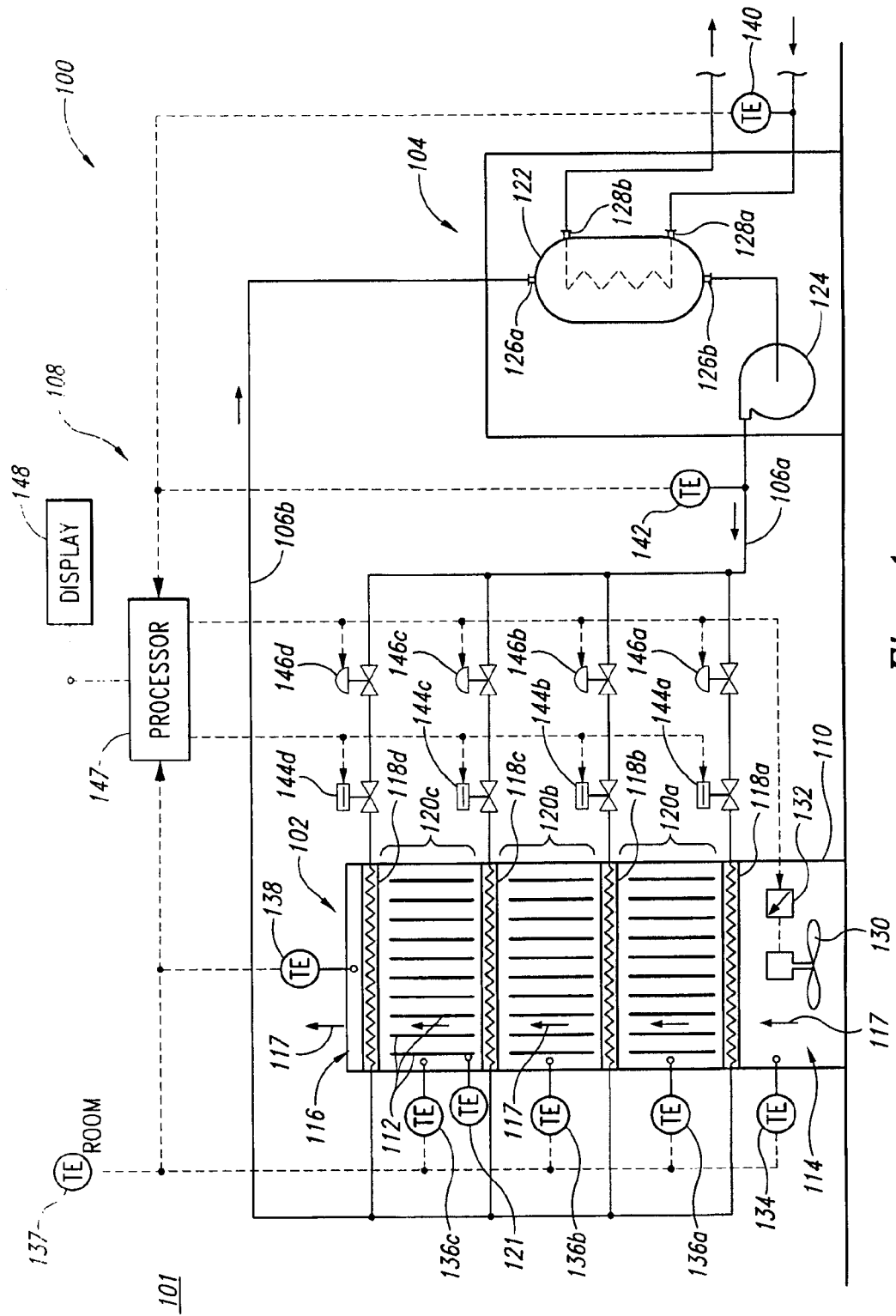
FIG. 1 is a partially schematic elevation view of a computer system having an air temperature control system configured in accordance with an embodiment of the invention.

FIG. 1 is a partially schematic elevation view of a computer system 100 having an air temperature control system 108 configured in accordance with an embodiment of the invention. The computer system 100 can include a computer cabinet 102 in a room 101 and coolant lines 106 (identified individually as a supply line 106a and a return line 106b) connecting the computer cabinet 102 to a heat removal system 104. In the illustrated embodiment, the heat removal system 104 is situated in the room 101 and spaced apart from the computer cabinet 102. In other embodiments, however, the heat removal system 104 can be integrated into the computer cabinet 102, positioned outside the room 101, or situated in other suitable places.

The computer cabinet 102 can include an air inlet 114 for receiving cooling air from the room 101, an air outlet 116 for discharging air to the room 101, and a plurality of computer module compartments 120a-c arranged vertically between the air inlet 114 and the air outlet 116 in a chassis 110. Individual compartments 120a-c can hold a plurality of computer modules 112 oriented edgewise with respect to a flow of the cooling air through the chassis 110.

The computer cabinet 102 can also include a plurality of heat exchangers 118a-d in the chassis 110. As described in greater detail below, individual heat exchangers 118a-d can be configured to receive working fluid (not shown) from the heat removal system 104 via the supply line 106a. After flowing through the heat exchangers 118a-d, the working fluid returns to the heat removal system 104 via the return line 106b. The working fluid can include hydrofluorocarbons, hydrochlorofluorocarbons, chlorofluorocarbons, ammonia, and/or other suitable refrigerants. The working fluid can be a vapor phase fluid, a liquid phase fluid, or a two-phase fluid when flowing through the heat exchangers 118a-d.

The computer cabinet 102 can additionally include an air mover 130 (e.g., a fan) positioned proximate to the air inlet 114 to facilitate movement of the cooling air through the chassis 110 in an air flow path 117. The air mover 130 can draw air from the room 101 into the chassis 110 through the air inlet 114. The air then flows through the chassis 110 past the computer modules 112 and exits the chassis 110 via the air outlet 116. In the illustrated embodiment, the air mover 130 is operatively coupled to a speed drive 132. In other embodiments, the speed drive 132 can be omitted.

The heat removal system 104 can include a pump 124 in fluid communication with a condenser 122. The condenser 122 can be a shell-and-tube type heat exchanger, a plate-and-frame type heat exchanger, or other suitable type of heat exchanger known in the art. The condenser 122 can include a working fluid inlet 126a for receiving heated working fluid returning from the computer cabinet 102, and a working fluid outlet 126b for supplying cooled working fluid to the pump 124. The condenser 122 can also include a coolant inlet 128a and a coolant outlet 128b for circulating chilled water, cooling water, or other suitable coolant (not shown) to cool the working fluid. The pump 124 can include a positive displacement pump, a centrifugal pump, or other suitable type of pump for circulating the working fluid back to the heat exchangers 118a-d via the supply line 106a.

The air temperature control system 108 ("control system 108") is configured to controllably cool the computer cabinet 102. The control system 108 can include an air inlet temperature sensor 134 positioned at or near the air inlet 114, compartment temperature sensors 136a-c positioned in the individual compartments 120a-c, respectively, module temperature sensors 121 positioned at individual computer modules 112 (only one is shown for purposes of illustration), and an air outlet temperature sensor 138 positioned at the air outlet 116. The control system 108 can also include a room temperature sensor 137, a working fluid temperature sensor 142 positioned at or near the discharge of the pump 124, and a coolant temperature sensor 140 positioned upstream of the coolant inlet 128a. The foregoing temperature sensors can include thermocouples, resistive temperature detectors, and/or other types of suitable temperature sensors known in the art. Although not shown in detail, the control system 108 can also include pressure sensors, flow rate sensors, humidity sensors, and/or other types of suitable sensors for detecting various operational parameters of the control system 108.

The control system 108 can also include a plurality of valves (e.g., block valves 144a-d and optional modulating valves 146a-d) on individual branches of the supply line 106a corresponding to the heat exchangers 118a-d. The block valves 144a-d can include solenoid valves or other suitable valves for allowing, stopping, or otherwise controlling the flow of working fluid to the individual heat exchangers 118a-d. The block valves 144a-d can also include positional switches that indicate the current state (i.e., open/close) of the corresponding block valves 144a-d to a processor 147. The modulating valves 146a-d can include globe valves, butterfly valves, ball valves, and/or other types of valves with corresponding actuators. The modulating valves 146a-d can have a liner flow characteristic, an equal-percentage flow characteristic, a parabolic flow characteristic, or other flow characteristics to control the flow rate of the working fluid supplied to the individual heat exchangers 118a-d.

The processor 147 can be operatively coupled to the temperature sensors 121, 134, 136a-c, 137, 138, 140, and 142, the block valves 144a-d, and the modulating valves 146a-d. The processor 147 can include a process logic controller, a system logic controller, or any other suitable logic controller. The control system 108 can optionally include a display 148 operatively coupled to the processor 147 for receiving operator input and/or outputting process parameters to an operator.

In operation, the air mover 130 draws air into the chassis 110 through the air inlet 114. The first heat exchanger 118a then cools the heated air before the air flows into the first compartment 120a. As the air flows through the first compartment 120a, the computer modules 112 in the first compartment 120a transfer heat to the air. The second heat exchanger 118b then cools the air before the air passes into the second compartment 120b by transferring heat from the air into the working fluid. The air is similarly inter-cooled by the third heat exchanger 118c before flowing into the third compartment 120c. The fourth heat exchanger 118d then cools the heated air leaving the third compartment 120c before the air is discharged to the room 101 via the air outlet 116.

In one embodiment, the working fluid is in phase transition between a liquid and a vapor when the working fluid leaves the heat exchangers 118a-d. In other embodiments, the working fluid can have other phase conditions at this time. The heated working fluid from the heat exchangers 118a-d returns to the condenser 122 via the return line 106b. The coolant in the condenser 122 cools the working fluid before the pump 124 circulates the working fluid back to the heat exchangers 118a-d.

In operation, the temperature sensors can monitor heat transfer between the computer cabinet 102 and the room 101. For example, the air inlet temperature sensor 134 can measure a temperature of the air flowing into the chassis 110 ($T_{IN}$), and the air outlet temperature sensor 138 can measure a temperature of the air flowing out of the chassis 110 ($T_{OUT}$). $T_{IN}$ and $T_{OUT}$ can be transmitted to the processor 147 to determine whether heat transfer between the computer cabinet 102 and the room 101 is balanced. As described in greater detail below, if not, the processor 147 can adjust a process parameter such that the imbalance is at least reduced.

In one embodiment, the processor 147 can calculate a temperature differential (ΔT) between the inlet temperature and outlet temperature as follows:

$$\Delta T = T_{IN} - T_{OUT}$$

If ΔT is greater than a first threshold ($\Delta T_1$) for a period of time, then the processor 147 can cause one of the block valves 144a-d to at least partially close. For example, if the fourth block valve 144d is open, then the processor 147 can close the fourth block valve 144d and stop the flow of working fluid to the fourth heat exchanger 118d. Consequently, the air discharged from the computer cabinet 102 to the room 101 will be at a higher temperature than before because the air leaving the third compartment 120c is not cooled, or is less cooled, by the working fluid. If the fourth block valve 144d is closed, the processor 147 can check another block valve, e.g., the third block valve 144c, for closure.

If ΔT is still above the first threshold $\Delta T_1$ after closing one of the block valves 144a-d for a period of time, the processor 147 can cause another block valve to close until ΔT is lower than $\Delta T_1$, or until all the block valves 144a-d are closed.

If ΔT is less than a second threshold ($\Delta T_2$), where $\Delta T_2$ is less than $\Delta T_1$, for a period of time, then the processor 147 can transmit an electrical signal to cause one of the block valves 144a-d to open. For example, if the first block valve 144a is open and the others are closed, then the processor 147 can cause the second block valve 144b to open. If ΔT is still less than the second threshold $\Delta T_2$ after a period of time, then the processor 147 can cause the third block valve to open. This process can be repeated until ΔT is greater than the second threshold $\Delta T_2$, or until all of the block valves 144a-d are open.

If ΔT is greater than $\Delta T_2$ but less than $\Delta T_1$, the processor 147 can modulate a process parameter to move ΔT is equal toward a desired temperature differential (e.g., zero). For example, in one embodiment, the processor 147 can vary the speed of the air mover 130 by adjusting the output of the speed drive 132. In another embodiment, the processor 147 can modulate the optional modulating valves 146a-d. For example, the fourth modulating valve 146d can be modulated using a proportional-integral-differential (PID) controller with ΔT as a process variable.

Several embodiments of the control system 108 can reduce the risk of overloading the heat removal system 104 by balancing the temperature between the computer cabinet 102 and the room 101. For example, in one embodiment, the air outlet temperature $T_{OUT}$ can be at least close to the room temperature (e.g., 32° C.). In conventional cooling systems, as the room temperature increases, the cooling load on the first heat exchanger 118a increases to compensate for the increased heat flux. Meanwhile, the cooling loads on the other heat exchangers 118b-d stay relatively constant because they only remove the heat generated by the computer modules 112. As a result, the air discharged into the room 101 can be at a lower temperature than the air flowing into the computer cabinet 102 because of the greater temperature drops at the first heat exchanger 118a. The increased load at the first heat exchanger 118a can potentially overload the heat removal system 104 and reduce the cooling efficiency of the heat exchangers 118b-d. Thus, the cooling loads on the individual heat exchangers 118a-d can be controlled by modulating the optional modulating valves 146a-d and/or the air mover 130, and by selectively closing/opening the block valves 144a-d, thereby preventing an overload of the heat removal system 104.

Although the control system 108 described above uses the temperature differential ΔT calculated by subtracting the air outlet temperature $T_{OUT}$ from the air inlet temperature $T_{IN}$, in other embodiments, a temperature differential calculated by subtracting the air inlet temperature $T_{IN}$ from the air outlet temperature $T_{OUT}$ can also be used. Moreover, other process parameters can also be used for controllably cooling the computer system 100. For example, the control system 108 can also use the compartment temperature(s), the computer module temperature(s), the room temperature, the working fluid temperature(s), the coolant temperature(s), and/or other suitable process parameters. In other embodiments, the processor 147 can also modulate the optional modulating valves 146a-d based on the individual compartment temperature(s), the computer module temperature(s), and/or other parameters. Even though only one computer module temperature sensor is shown in FIG. 1, in other embodiments, the control system 108 can include any desired number of computer module temperature sensors.

In any of the foregoing embodiments, certain interlock conditions can override the control actions of the processor 147. For example, if one of the compartment temperature sensors 136a-c or the computer module sensor 121 indicates a temperature that exceeds a threshold, the processor 147 can force the block valves 144a-d to open irrespective of the current temperature differential ΔT. Other interlock conditions can include high room temperature, high working fluid temperature, high coolant temperature, and/or other threshold conditions.

Only a single computer cabinet 102 is shown in FIG. 1 for purposes of illustration and ease of reference. In other embodiments, however, supercomputers and other large computer systems can include a plurality of computer cabinets arranged in banks or other configurations. In such embodiments, the heat removal system 104 can provide working fluid to one or more of the computer cabinets 102 via an appropriately configured piping circuit. Further, although the heat exchangers 118a-d have been described above in the context of working fluid-type heat exchangers, in other embodiments, other types of heat exchangers can be used to inter-cool the air moving through the compartments 120 without departing from the spirit or scope of the present invention. One example is disclosed in U.S. patent application Ser. No. 10/805,875, filed Mar. 22, 2004, the disclosure of which is incorporated herein in its entirety.

Figure 2:
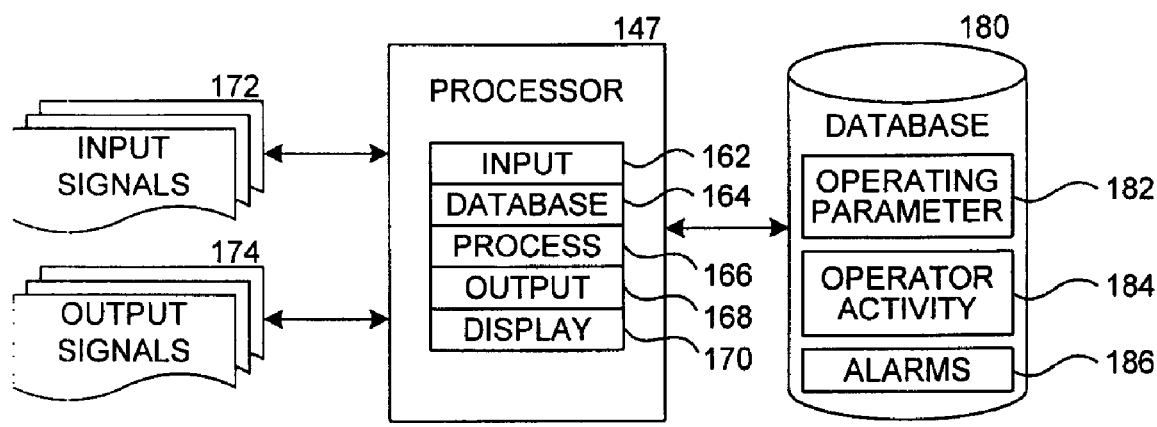
FIG. 2 is a functional diagram showing software modules configured in accordance with an embodiment of the invention for controlling the air temperature control system of FIG. 1.

FIG. 2 illustrates a functional diagram showing software modules suitable for use in the processor 147 of FIG. 1. Each component can be a computer program, procedure, or process written as source code in a conventional programming language, such as the C++ programming language, and can be presented for execution by the processor 147. In another embodiment, the software modules can be presented for execution by the CPU of a network server in a distributed computing scheme. The various implementations of the source instructions and object and byte instructions can be stored on a computer-readable storage medium or embodied on a transmission medium in a carrier wave. In the illustrated embodiment, the modules include an input module 162, a database module 164, a process module 166, an output module 168, and optionally, a display module 170. In other embodiments, the modules can also include a network module and/or other modules.

In operation, the input module 162 accepts operating input from an operator and communicates the accepted information or selections to other components for further processing. For example, the input module 162 can accept a temperature differential setpoint and/or other process setpoints from an operator. The input module 162 can also accept start/stop commands for the air mover 130 (FIG. 1), open/close commands for the individual block valves 144a-d (FIG. 1), and/or other control selections.

The database module 164 organizes records, including operating parameters 182, operator activities 184, and alarms 186, and facilitates storing and retrieving these records to and from a database 180. Any type of database organization can be utilized, including a flat file system, hierarchical database, relational database, or distributed database, such as provided by a database vendor such as the Oracle Corporation of Redwood Shores, Calif.

The process module 166 can generate control signals based on input signals 172, e.g., operator input, and/or internal components (e.g., a clock, a sequencer, timers, counters, PID control loops, etc.), as described in more detail below with reference to FIG. 4. The output module 168 can generate output signals 174 based on the control signals from the process module 166. For example, the output module 168 can convert the control signals into 4-20 mA output signals 174 suitable for controlling the modulating valves 146a-d (FIG. 1), or into discrete signals for actuating the block valves 144a-d. The processor 147 can optionally include the display module 170 for displaying, printing, or downloading the input signals 172 and output signals 174 via devices such as the display 148 (FIG. 1). A suitable display module 170 can include a video driver that enables the processor 147 to output the input signals 172 on the display 148.

Figure 3:
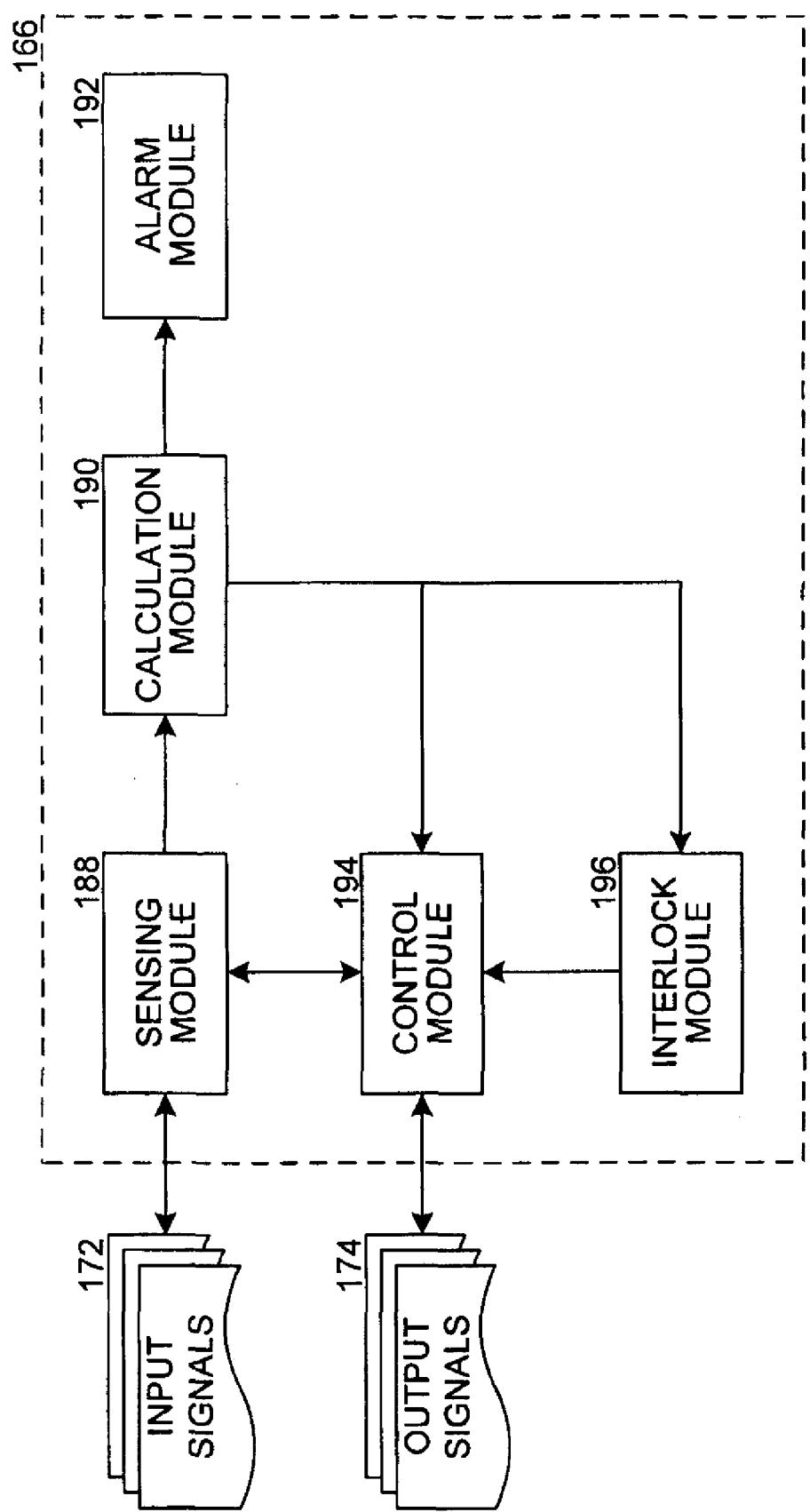
FIG. 3 is a block diagram illustrating a process module suitable for use in the air temperature control system of FIG. 2.

FIG. 3 is a block diagram showing an embodiment of the process module 166 of FIG. 2. The process module 166 can include a sensing module 188, a calculation module 190, an alarm module 192, a control module 194, and an interlock module 196 interconnected to each other. The individual modules can include computer programs, procedures, or routines written as source instructions in conventional programming languages, or one or more of the modules can include hardware modules.

The sensing module 188 can receive and convert the input signals 172 into parameters in desired units. For example, the sensing module 188 can receive the input 172 as electrical signals (e.g., as 4-20 mA analog signals) and convert the electrical signals into instant temperatures in, e.g., Celsius. The sensing module 188 can include various routines, such as linear interpolation, logarithmic interpolation, data mapping, and/or other routines to associate the input 172 with parameters in desired units.

The calculation module 190 can perform addition, subtraction, multiplication, quotient, integration, differentiation, and other types of calculations to facilitate operation of the other modules. For example, the calculation module 190 can derive the temperature differential ΔT based on the sensed air inlet temperature and air outlet temperature.

The alarm module 192 can generate alarms based on output from the calculation module 190 and/or the sensing module 188. For example, the alarm module 192 can compare the temperature differential ΔT determined by the calculation module 190 to a threshold value. If the average temperature exceeds the threshold value, the alarm module 192 can issue an alarm by raising a flag or by providing some other type of response. In response to the alarm flag, the display 148 (FIG. 1) can issue a notification by displaying a flashing message, sounding a horn, turning on a warning light, and/or providing another visual, tactile, and/or audible indicator.

The control module 194 can generate the output signals 174 for modulating the modulating valves 146a-d and/or closing/opening the block valves 144a-d. The control module 194 can include comparators, PID loops, timers, counters, and/or other logic modules for generating control variables.

For example, the control module 194 can include a comparator that compares the calculated temperature differential ΔT to a threshold value and generates an output signal based on the results of the comparison.

The interlock module 196 can continuously monitor operating parameters received from the sensing module 188 and/or the calculation module 190, and the interlock module 196 can interrupt operation of the control module 194 when the operating parameters exceed certain threshold values. For example, the interlock module 196 can cause the control module 194 to terminate operation (i.e., have zero output value) when the compartment temperatures from the calculation module 190 exceed a preset threshold value.

Figure 4:
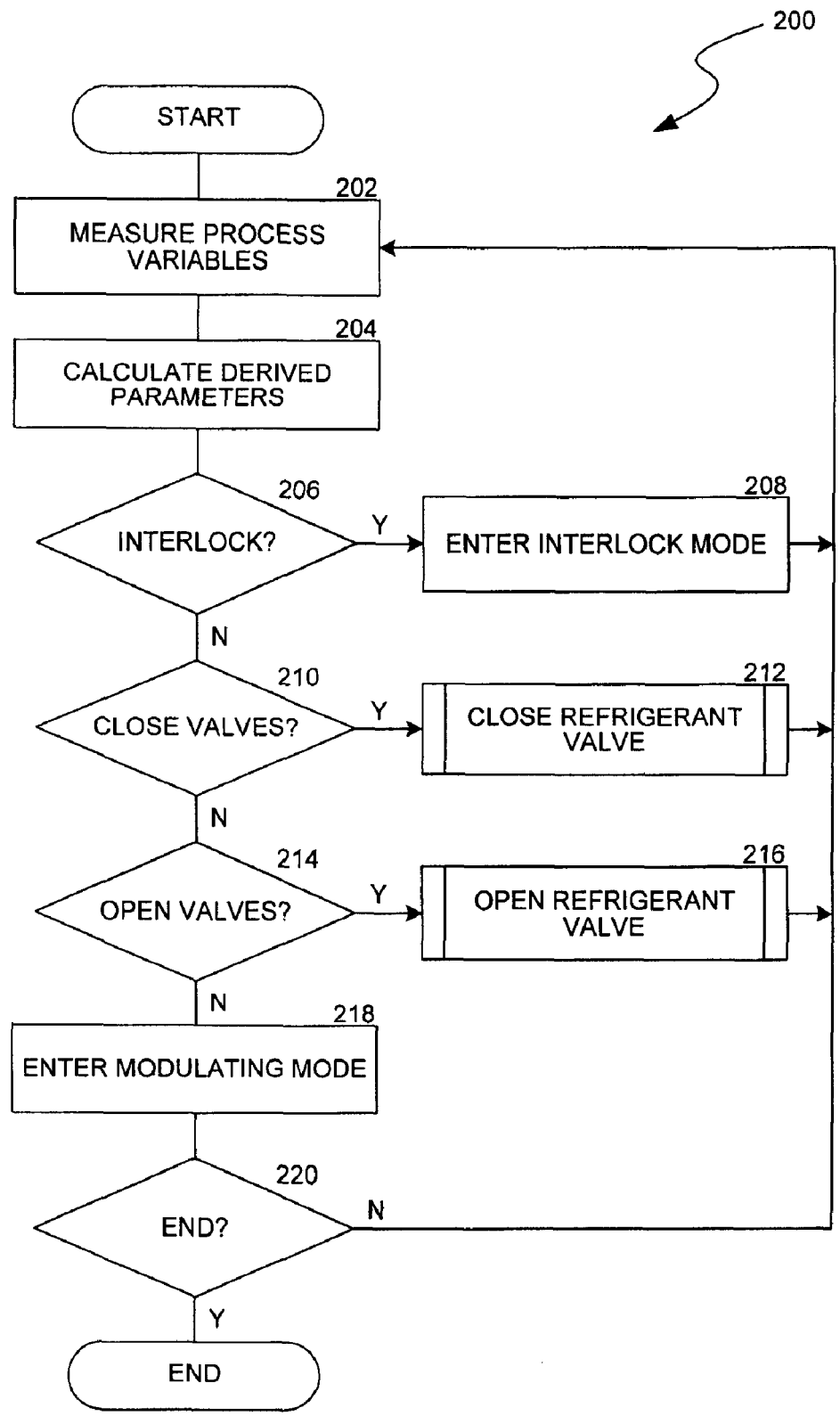
FIG. 4 is a flow chart illustrating a method for cooling a computer system in accordance with an embodiment of the invention.

FIG. 4 is a flow chart illustrating a method 200 for cooling a computer system in accordance with an embodiment of the invention. The method 200 can be implemented as a computer program for the processor 147 of FIGS. 1 and 2, or can be carried out manually. The method 200 is described below in the context of the computer system 100 of FIG. 1 for purposes of illustration. Those of ordinary skill in the art will understand, however, that the method 200 can also be performed in other computer systems having similar or different configurations.

Referring to FIGS. 1 and 4 together, the method 200 can include suitable sensors for measuring process variables of the computer system 100 (block 202). The process variables can include the room temperature, the air inlet temperature, the air outlet temperature, the compartment temperature(s), the working fluid temperature(s), the coolant temperature(s), and/or other temperatures. The process variables can also include the current status of the block valves 144a-d, the optional modulating valves 146a-d, the pump 124, the air mover 130, and/or other equipment of the computer system 100. The process variables can further include various pressures (e.g., the discharge pressure of the pump 124), flow rates (e.g., the air flow rate in the chassis 110), and/or other parameters.

The method 200 can further include calculating derived parameters from the measured process variables (block 204). For example, the air temperature differential ΔT of the computer cabinet 102 can be calculated by subtracting the air outlet temperature $T_{OUT}$ from the air inlet temperature $T_{IN}$. In another example, an average temperature can be calculated based on the measured temperatures over a period of time according to the following formula:

$$T_{avg} = \frac{\Sigma T_i}{N}$$

where $T_i$ is a measured temperature, $T_{avg}$ is the average temperature, and N is the number of temperature records. Other averaging techniques, such as an exponential moving average, can also be used. In yet another example, a rate of change for the measured temperatures can be calculated according to the following formula:

$$\frac{dT}{dt} \approx \frac{T_{i+1} - T_i}{\Delta t}$$

where $T_{i+1}$ is the temperature record number i+1, $T_i$ is the previous temperature record, and Δt is the time difference between the two temperature records. In further examples, calculating derived parameters can also include applying accumulation, integration, differentiation, and/or other types of data processing techniques to the measured process variables.

The method 200 can include checking for interlock conditions (block 206). The interlock conditions can include those indicating an unsafe or undesired operating state. For example, the following is a non-exhaustive list of interlock conditions:

(1) At least one of the measured compartment temperatures exceeds a maximum temperature threshold (e.g., about 40° C. to about 45° C.).
(2) The computer module temperature exceeds a maximum temperature threshold (e.g., about 45° C.).
(3) The room temperature exceeds a maximum temperature threshold (e.g., about 32° C.).
(4) The working fluid temperature exceeds a maximum temperature threshold (e.g., about 25° C.).
(5) The coolant temperature exceeds a maximum temperature threshold (e.g., about 20° C.).

If any interlock condition exists, then the process enters an interlock mode (block 208). In the interlock mode, the processor 147 can command all of the block valves 144a-d to open and the optional modulating valves 146a-d and the speed drive 132 to be at 100% output. As a result, a maximum amount of the working fluid is supplied to the heat exchangers 118a-d, and the air mover 130 is operating at full speed (e.g., 1800 rpm). The processor 147 can also issue an alarm via the display 148 and/or perform other control actions to alert an operator of the interlock mode. After entering the interlock mode, the method 200 reverts to measuring process variables at block 202.

If no interlock condition exists, the method 200 continues to check whether one or more of the block valves 144a-d should be closed (block 210). The conditions for closing one or more of the block valves 144a-d can include those indicating a temperature imbalance in the computer cabinet 102 with respect to the room 101, and/or overload of the heat removal system 104. For example, the following is a non-exhaustive list of such conditions:

(1) The temperature differential ΔT is greater than the first threshold $\Delta T_1$ for a preset period of time (e.g., 1 minute).
(2) The working fluid temperature exceeds a maximum temperature threshold (e.g., about 20° C.).
(3) The pump 124 is cavitating.

If such a condition exists, then the processor 147 can close one of the block valves 144a-d (block 212), as described in more detail below with reference to FIG. 5. Next, the method 200 reverts to measuring process variables at block 202.

If no valve closing conditions exist, the method 200 proceeds to check whether one of the block valves 144a-d should be open (block 214). The conditions for opening one of the block valves 144a-d can include those indicating insufficient cooling in the computer cabinet 102. For example, the following is a non-exhaustive list of such conditions:

(1) At least one of the measured compartment temperatures exceeds a maximum temperature threshold (e.g., about 35° C.).
(2) The air outlet temperature exceeds a maximum temperature threshold (e.g., about 32° C.).
(3) The working fluid temperature exceeds a minimum temperature threshold (e.g., about 15° C.).

If one or more of these conditions exist, then the processor 147 can open one or more of the block valves 144a-d (block 216), as described in more detail below with reference to FIG. 6. Next, the method 200 reverts to measuring process variables at block 202.

If no valve opening conditions exist, the method 200 proceeds to enter a modulating mode (block 218). In the modulating mode, the processor 147 can modulate various components of the computer system 100 to achieve a temperature balance between the computer cabinet 102 and the room 101, and/or to achieve another result. In one embodiment, the processor 147 can modulate the speed of the air mover 130 by using a PID loop to vary the output of the speed drive 132. In another embodiment, the processor 147 can modulate at least one of the optional modulating valves 146a-d by using a PID loop to vary the output to the modulating valves 146a-d.

The method 200 can further include determining whether to continue the process (block 220). The determination can be made based on, for example, whether the computer system 100 is operating, or some other operating conditions. If not, the process ends; otherwise, the method 200 reverts to measuring process variables at block 202.

Several embodiments of the method 200 can improve computer system cooling over conventional techniques. With conventional techniques, the heat transfer between the working fluid and the cooling air at the heat exchangers is generally uncontrolled. As a result, when at least one of the process parameters starts to vary, the heat exchanging performance may suffer. For example, with conventional techniques, the flow rate of the working fluid cannot be easily adjusted to compensate for increases in cooling air temperature and/or flow rate. As a result, the cooling air flowing into individual compartments may be at elevated temperatures, which may reduce the performance of the computer modules in the compartments. Thus, improved performance of the computer system can be achieved by monitoring and actively controlling the cooling process in the computer system.

Figure 5:
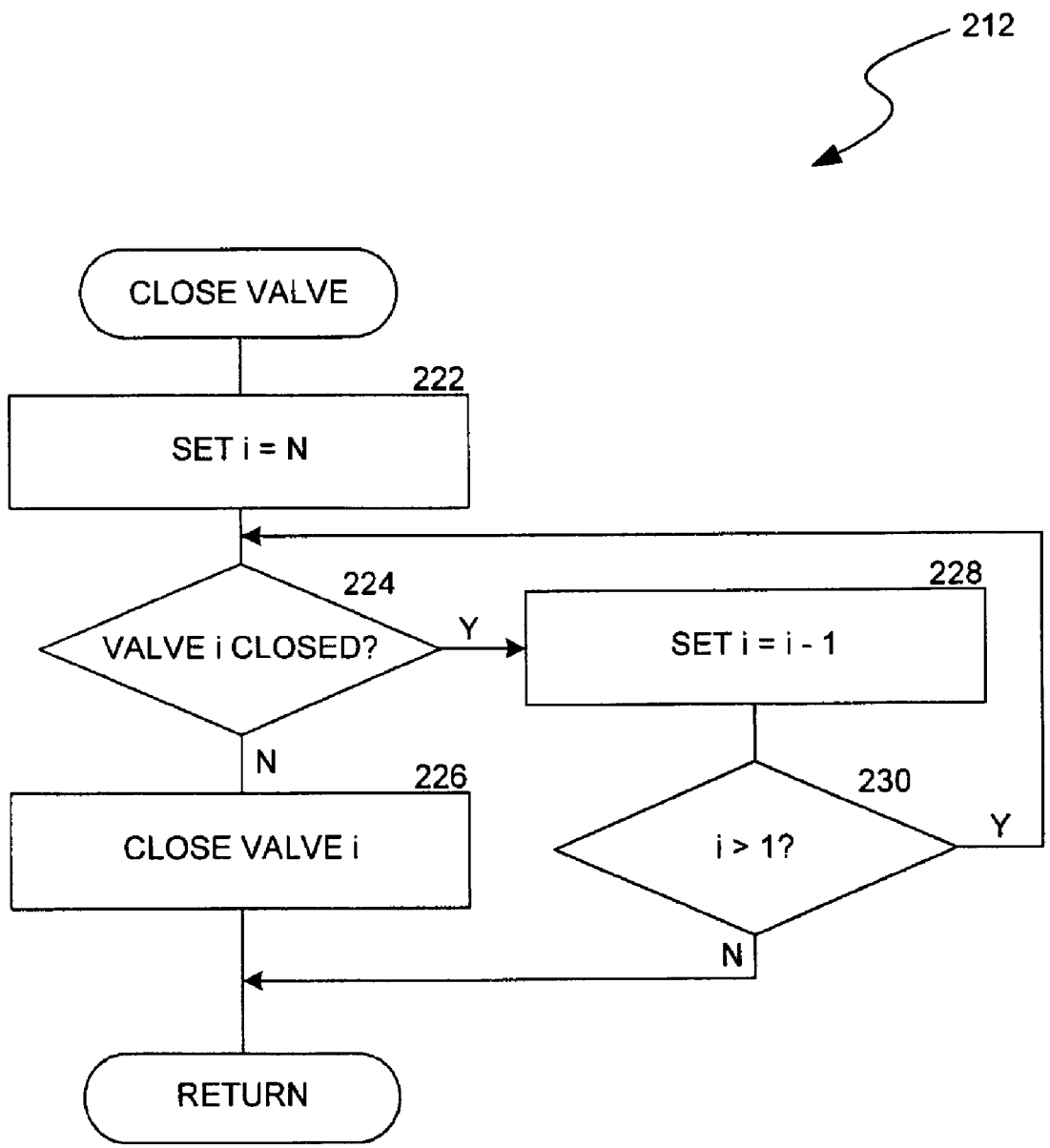
FIG. 5 is a flow chart illustrating a method of closing valves in the air temperature control system of FIG. 1, suitable for use in the method of FIG. 4.

FIG. 5 is a flow chart illustrating a method 212 of sequentially closing valves in a computer system in accordance with an embodiment of the invention. The method 212 can be used in the method 200 of FIG. 4. For purposes of illustration, in this example and in other examples, valves are numbered from 1 to N (an integer greater than 1) with valve No. 1 being proximate to the air inlet and valve N being proximate to the air outlet. Other numbering conventions can also be used.

The method 212 can include initiating a counter i with an initial value of N (block 222). Using the computer system 100 of FIG. 1 as an example, the initialized value of i would be 4 because there are four block valves in the computer system 100. The method 212 can also include checking whether valve i is closed (block 224) by monitoring a position switch operatively coupled to valve i, monitoring the current output to valve i, monitoring a flow rate of the working fluid passing valve i, and/or by utilizing other techniques. If valve i is open, then the method 212 continues to close valve i (block 226). If valve i is closed, the method 212 continues to set i=i−1 (block 228). The method 212 then determines whether i is greater than 1 (block 230). If yes, then the process reverts to block 224; otherwise, the process returns.

Figure 6:
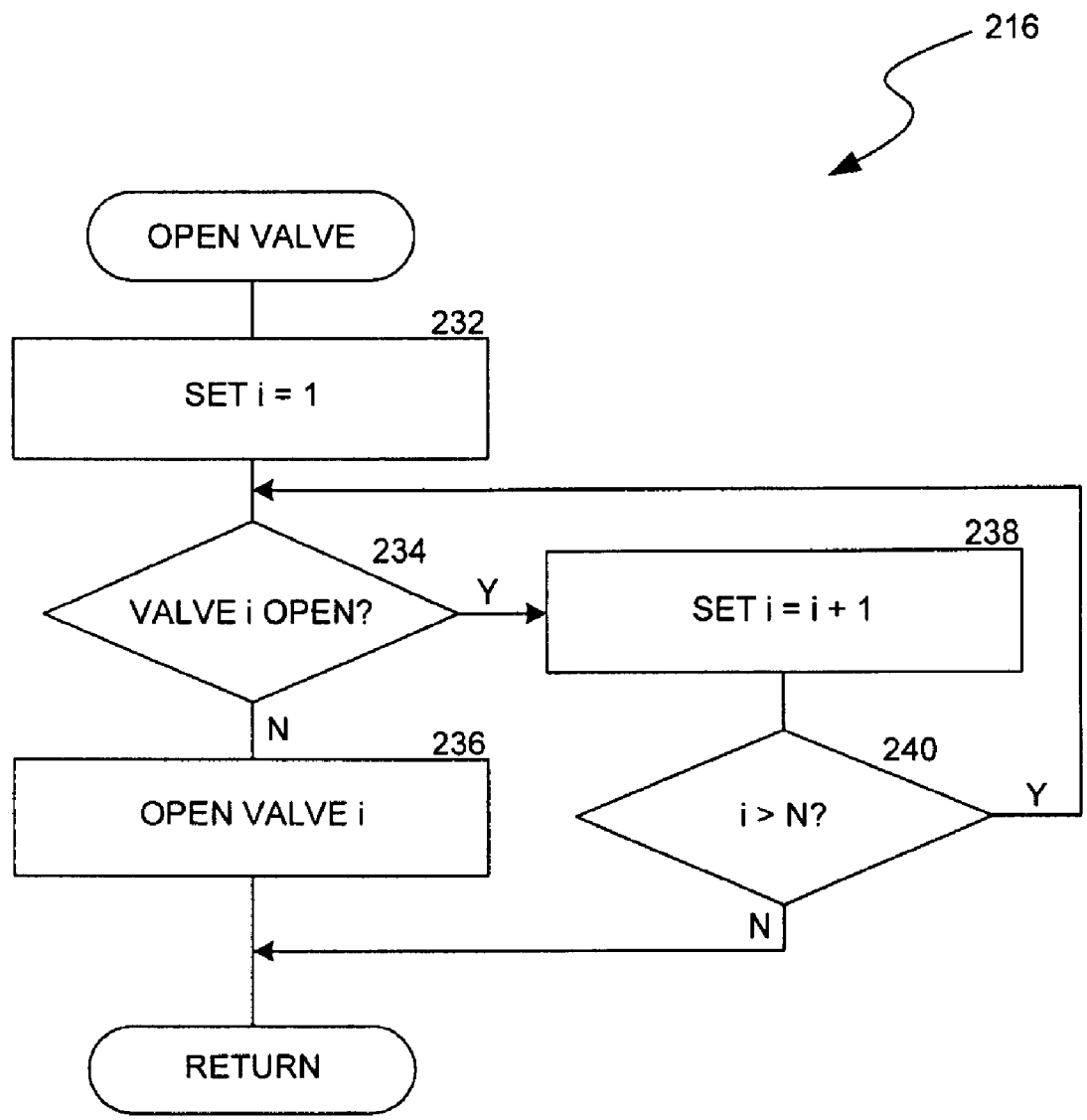
FIG. 6 is a flow chart illustrating a method of opening valves in the air temperature control system of FIG. 1, suitable for use in the method of FIG. 4.

FIG. 6 is a flow chart illustrating a method 216 of opening valves in a computer system in accordance with an embodiment of the invention. The method 216 can be used in the method 200 of FIG. 4. The method 216 can include initiating a counter i with an initial value of 1 (block 232). The method 216 can also include checking whether valve number i is open (block 234). If valve i is closed, then the method 216 proceeds to open valve i (block 236). If valve i is open, the method 216 proceeds to set i=i+1 (block 238). The method 216 then determines whether i is less than N (block 240). If yes, then the process reverts to block 234; otherwise, the process returns.

From the foregoing, it will be appreciated that specific embodiments of the invention have been described herein for purposes of illustration, but that various modifications may be made without deviating from the spirit and scope of the invention. Further, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited, except as by the appended claims.

We claim:

1. A computer system, comprising:
a computer cabinet having an air inlet spaced apart from an air outlet, and at least a first computer module compartment spaced apart from a second computer module compartment, wherein the air inlet, the air outlet, and the computer module compartments define an air flow path through the computer cabinet;
an air inlet temperature sensor positioned proximate to the air inlet for measuring an inlet air temperature;
an air outlet temperature sensor positioned proximate to the air outlet for measuring an outlet air temperature;
at least a first heat exchanger positioned upstream of the first computer module compartment in the air flow path, a second heat exchanger positioned between the first and second computer module compartments in the air flow path, and a third heat exchanger positioned downstream of the second computer module compartment in the air flow path;
a heat removal system in fluid communication with the heat exchangers for circulating working fluid between the heat removal system and the heat exchangers;
a first valve in a first working fluid conduit corresponding to the first heat exchanger, a second valve in a second working fluid conduit corresponding to the second heat exchanger, and a third valve in a third working fluid conduit corresponding to the third heat exchanger; and
a control system operatively coupled to the air outlet temperature sensor and the air inlet temperature sensor, and wherein the control system includes a computer-readable medium containing instructions for calculating a temperature differential according to the following formula:

$$\Delta T = T_{IN} - T_{OUT}$$

where $\Delta T$ is the temperature differential, $T_{IN}$ is the air inlet temperature, and $T_{OUT}$ is the air outlet temperature, and wherein the computer-readable medium further includes instructions for calculating the temperature differential at a first time and at least partially closing the third valve if the calculated temperature differential is greater than a threshold at the first time, and for calculating the temperature differential at a second time, after the first time, and at least partially closing the second valve if the calculated temperature differential is greater than the threshold at the second time.

2. The computer system of claim 1 further comprising a plurality of module compartment temperature sensors positioned at a plurality of corresponding computer module compartments.

3. The computer system of claim 1 wherein the computer-readable medium includes instructions for comparing the air inlet temperature to the air outlet temperature.

4. The computer system of claim 1, further comprising an interlock module that overrides the control system when a temperature of at least one processing device positioned in the computer cabinet exceeds an interlock threshold.

5. The computer system of claim 1 wherein the computer-readable medium further includes instructions for stopping a flow of the working fluid to one of the heat exchangers if the calculated temperature differential is greater than the threshold.

6. The computer system of claim 4 wherein the control system further includes a processor operably connected to the temperature sensors and the valves.

7. The computer system of claim 1 wherein the threshold is a first threshold, and wherein the computer-readable medium further includes instructions for starting a flow of the working fluid to one of the heat exchangers if the calculated temperature differential is less than a second threshold.

8. The computer system of claim 1 wherein the threshold is a first threshold, and wherein the computer-readable medium further includes instructions for opening at least one of the valves if the calculated temperature differential is less than a second threshold.

9. The computer system of claim 1 wherein the computer cabinet further includes an air mover, and wherein the computer-readable medium further includes instructions for adjusting a speed of the air mover based on the calculated temperature differential.

10. The computer system of claim 1 wherein the computer-readable medium further includes instructions for modulating a flow rate of the working fluid to at least one of the heat exchangers based on the calculated temperature differential.

* * * * *